(12) United States Patent
Mair

(10) Patent No.: US 6,635,820 B1
(45) Date of Patent: Oct. 21, 2003

(54) SHEILDING DEVICE FOR AN ELECTRICAL MODULE SUPPORT

(75) Inventor: Eduard Mair, München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/958,757

(22) PCT Filed: Apr. 3, 2000

(86) PCT No.: PCT/DE00/01016
§ 371 (c)(1),
(2), (4) Date: Oct. 15, 2001

(87) PCT Pub. No.: WO00/64230
PCT Pub. Date: Oct. 26, 2000

(30) Foreign Application Priority Data

Apr. 16, 1999 (DE) ............................. 199 17 382

(51) Int. Cl.$^7$ ................................. H05K 5/03
(52) U.S. Cl. ............... 174/35 R; 174/35 GC; 361/816; 361/818
(58) Field of Search .............. 174/35 R, 35 MS, 174/35 GC, 138 E, 154; 361/816, 818

(56) References Cited

U.S. PATENT DOCUMENTS

| 5,834,082 A | * | 11/1998 | Day ............................. 428/56 |
| 5,928,076 A | * | 7/1999 | Clements et al. ........... 454/184 |
| 6,163,454 A | * | 12/2000 | Strickler ..................... 361/695 |
| 6,313,997 B1 | * | 11/2001 | Speraw ....................... 361/741 |

FOREIGN PATENT DOCUMENTS

| AT | 364 441 | 10/1981 |
| AT | 378 097 | 6/1985 |
| EP | 0 351 070 | 1/1990 |
| WO | WO 92/16093 | 9/1972 |

* cited by examiner

Primary Examiner—Dean A. Reichard
Assistant Examiner—W. David Walkenhorst
(74) Attorney, Agent, or Firm—Schiff Hardin & Waite

(57) ABSTRACT

The mounting rack has upper and lower outer walls which are each formed from two perforated shielding panels which are parallel to one another and at a distance from one another. As a result, the shielding attenuation of the mounting rack is considerably increased. In order to reduce the flow resistance, an intermediate space between the two shielding panels is filled with a congruently perforated insulator.

4 Claims, 1 Drawing Sheet

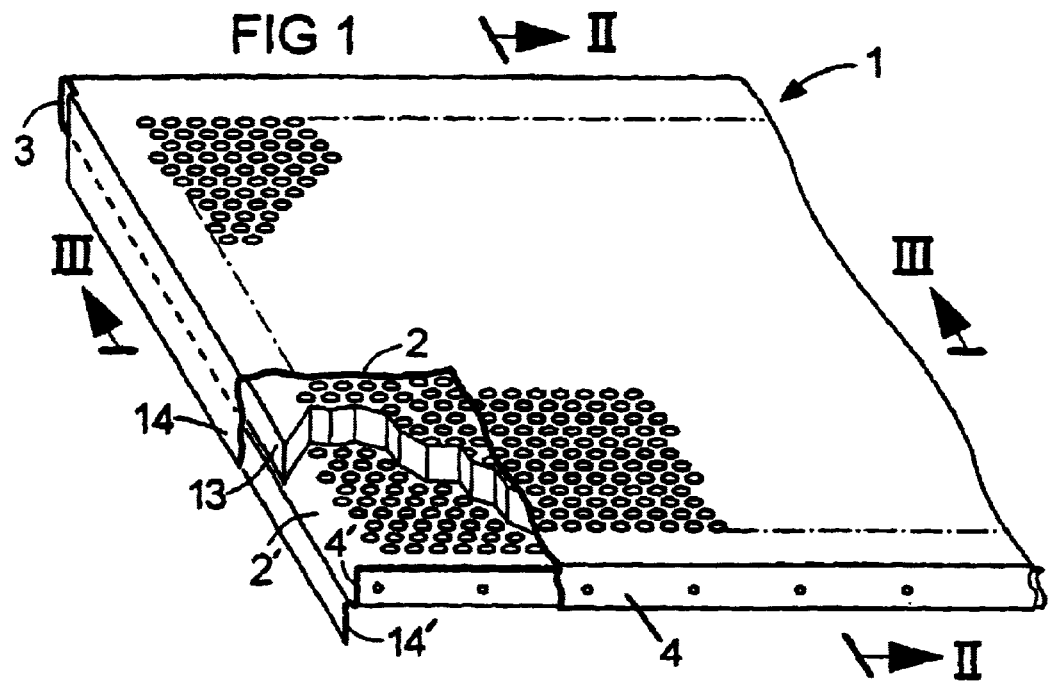
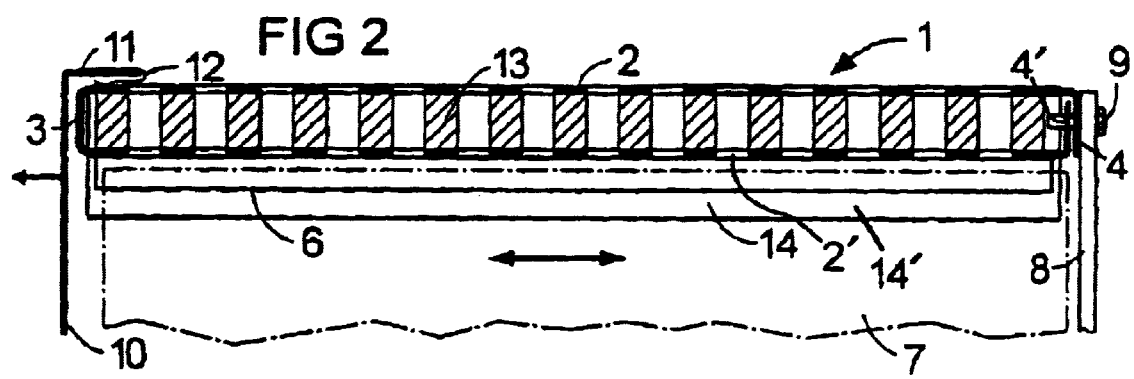
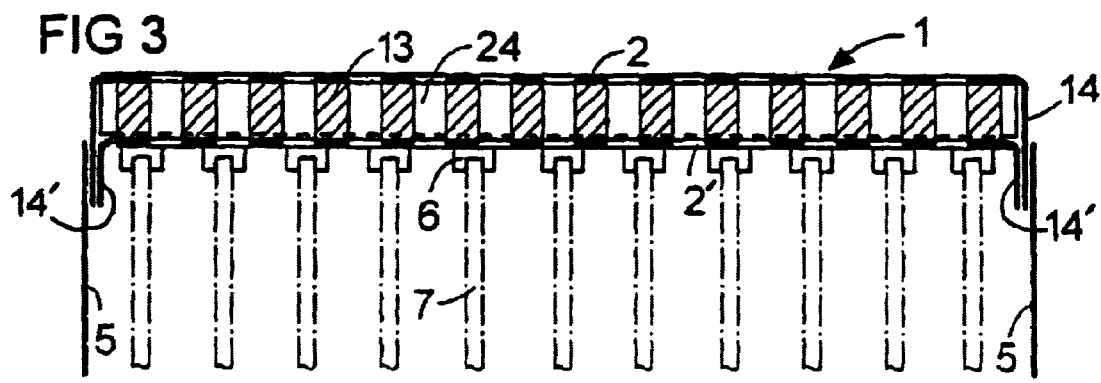

SHEILDING DEVICE FOR AN ELECTRICAL MODULE SUPPORT

BACKGROUND OF THE INVENTION

The invention relates to a shielding device for a mounting rack for holding insertable, electrical modules. At least one outer wall of the device or component has a perforated, grounded shielding panel for electromagnetically shielding and conducting away heat from the device.

Such a mounting rack has been disclosed, for example, by WO 92/16093. According to this document, a shielding housing of a module rack is composed of aluminum sheet metal, and the upper and lower sides are embodied as perforated panels in order to conduct away heat from the mounting rack. Such aluminum sheets are, for example, 2 mm thick and have good electrical conductivity. The large thickness of the shielding panel produces favorable shielding conditions even when there is a high proportion of holes.

A disadvantage here is that the mounting rack cannot be exclusively fabricated from aluminum parts so that when it is disposed of the various materials have to be separated, which is costly.

EP 0351070 A, which corresponds to U.S. Pat. No. 4,872,090, discloses a shielding housing for an electrical module which has two walls lying opposite one another with each wall being formed from two perforated panels. The panels have ventilation holes offset with respect to one another, so that a very good shielding effect is achieved. However, the offset of the ventilation holes impedes the throughflow of the cooling air.

SUMMARY OF THE INVENTION

The present invention is based on the object of improving the shielding properties of the outer wall, cooling of the modules and reducing the cost of disposal.

These objects are achieved with a shielding device for a mounting rack for holding insertable electrical modules. At least one outer wall of the shielding device has two perforated, grounded shielding panels for electromagnetically shielding and conducting away heat from modules. The shielding panels extend at least approximately parallel to one another and at a distance from one another with an intermediate space between the two shielding panels being filled with an insulator against which the two shielding panels directly bear and the two shielding panels and the insulator have perforation patterns which are congruent with one another and are aligned with respect to one another.

The arrangement of two shielding panels which are parallel with one another and at a distance from one another improves the shielding effect of the outer wall considerably. Trials have shown that the shielding attenuation with an optimum arrangement and embodiment of the shielding panels is increased by more than 20 dB in comparison with a single panel. The double-walled construction enables the stability of the outer wall to be considerably increased. It is therefore possible to reduce the thickness of the panel without adversely affecting the increased shielding effect. As a result, it is possible to use other materials which can be more easily disposed of It is now possible to manufacture the shielding panel from considerably thinner stainless steel or chrome steel. The other parts of the housing and the mounting elements can also be manufactured from this material so that such a mounting rack can be disposed of without difficulty.

The distance or intermediate space between the panels of one to eight times the thickness of a panel permits the shielding attenuation to be increased considerably. At the same time, the holes of the two shielding panels can be respectively arranged in an aligned fashion in order to improve ventilation without adversely affecting the shielding effect.

A particularly high level of shielding attenuation is achieved with a distance of only four times the thickness of the panel. This means that the shielding panels can be arranged at a relatively small distance from one another so that the outer dimensions of the mounting rack are increased only to a small extent.

The congruent perforation patterns of the two panels and the insulator reduce the number of disruptive edges and reduce the flow resistance between the two shielding panels considerably, so that the through flow rate of cooling air is increased but the shielding effect is not adversely affected.

The insulator is preferably a flat perforated panel, which is composed of foam material, which preferably has a laminated surface in the region of the perforations, is cost-effective to manufacture and easy to use.

The two shielding panels and the insulator are embodied as a sandwich, whose parts are connected to one another by a material and results in a particularly stable outer wall which permits the thickness of the panel to be reduced, accompanied by a high level of stability.

The invention is explained in more detail below with reference to an exemplary embodiment illustrated in the drawing.

BRIEF DESCRIPTION OF THE DRAWINGS

FIG. 1 is a perspective view of an upper outer wall of a mounting rack with portions removed for purposes of illustration;

FIG. 2 is a cross sectional view through the outer wall taken along the line II/II in FIG. 1 with a wiring backplane and an insertable module; and FIG. 3 is a cross sectional view through the outer wall taken along the line III/III in FIG. 1 with a side wall of the mounting rack.

DESCRIPTION OF THE PREFERRED EMBODIMENT

According to FIGS. 1, 2 and 3, an upper outer wall 1 of a mounting rack is composed of two perforated shielding panels 2 and 2' which lie one on top of the other at a distance, are parallel with one another and are connected to one another in two right-angled bends to form one component by means of a connecting web 3 at the front. The two shielding panels 2 and 2' have, along their other edges, webs 4, 4', 14 and 14' which are bent at right angles and which each extend over the entire length of the edge and overlap one another. Here, the rear webs 4 and 4' which lie opposite the connecting web 3 are bent in the opposite direction so that the rear web 4' associated with the lower shielding panel 2' is bent toward the outside and does not restrict the insertion space of the mounting rack.

The two other pairs of webs 14 and 14' are bent downward in the same direction, the lateral web 14 which is associated with the upper shielding panel 2 being wider by the distance between the two shielding panels so that complete overlapping occurs here also. In each case a side wall 5 of the mounting rack is attached to these lateral webs 14 by means of connecting elements (not illustrated here in more detail).

Guides 6 for insertable electrical modules 7 which can be inserted into the mounting rack from the front side are detachably attached to the inner side of the lower shielding panel 2'. On the underside of the mounting rack there is a second outer wall (not illustrated) with guides in a mirror-symmetrical arrangement. This outer wall is also connected to the side walls 5 in the same way as the upper outer wall 1.

A wiring backplane 8 is attached to the rear webs 4 and 4' of the two panels of the outer upper wall 1 by means of connecting elements 9 which are embodied as screws and which engage with their threads into the rear web 4 and 4' facing away from the wiring backplane 8 and thus clamp the wiring backplane 8 to the rear webs 4 and 4' and the latter to one another. The wiring backplane 8 is provided with shielding layers which are in contact with the rear webs 4.

The front side of the mounting rack which faces the connecting web 3 is closed off by means of a door 1 0 which engages around the outer upper wall 1 with an angled side web 11. A feathered sealing strip 12 is attached to the side web 11, bears against the upper shielding panel 2 along the connecting web 3 and slides, when the door 10 is opened and closed, over the rounded bending edge between the upper shielding panel 2 and the connecting web 3.

The intermediate space between the two shielding panels 2 and 2' is filled by an insulating perforated panel 13. The perforation patterns of the two shielding panels 2 and 2' and the patterns of the perforated panel 13 are of congruent design and in an aligned arrangement so that a through-going channel 24, which leads linearly through the two shielding panels 2 and 2' and the perforated panel 13, is formed at each of the individual holes. As a result, when the cold air passes through, eddying, which without the perforated panel 13 would occur between the two shielding panels 2 and 2', in particular at the inner edges of the holes, is avoided. The flow resistance is reduced and the cooling air throughput rate increased, without the shielding effect being impaired.

I claim:

1. A shielding device for a mounting rack for holding insertable electrical modules, said device having at least one outer wall having two perforated, grounded shielding panels for electromagnetically shielding and conducting away heat from the modules, the shielding panels extending at least approximately parallel to one another and at a distance from one another to form an intermediate space; and an insulator having perforations being disposed in the intermediate space with the two shielding panels directly bearing thereon, said two shielding panels and the insulator having perforation patterns being congruent so that disruptive edges and flow resistance are reduced.

2. A shielding device according to claim 1, wherein the insulator is a flat perforated panel.

3. A shielding device according to claim 2, wherein the perforated panel is composed of a foamed material which has a laminated surface at least in the region of the perforations.

4. A shielding device according to claim 3, wherein the two shielding panels and the perforated panel are embodied as a sandwich whose parts are connected to one another using a material.

* * * * *